United States Patent
Bergin et al.

(10) Patent No.: US 10,803,210 B2
(45) Date of Patent: Oct. 13, 2020

(54) REAL-TIME ELECTROMAGNETIC ENVIRONMENTAL SIMULATOR

(71) Applicant: INFORMATION SYSTEMS LABORATORIES, INC., San Diego, CA (US)

(72) Inventors: Jameson S. Bergin, Glastonbury, CT (US); Joseph R. Guerci, Arlington, VA (US)

(*) Notice: Subject to any disclaimer, the term of this patent is extended or adjusted under 35 U.S.C. 154(b) by 446 days.

(21) Appl. No.: 14/995,995

(22) Filed: Jan. 14, 2016

(65) Prior Publication Data

US 2017/0206287 A1 Jul. 20, 2017

(51) Int. Cl.
*G06F 30/20* (2020.01)
*G02F 1/29* (2006.01)
*G06G 7/78* (2006.01)
*G01S 7/40* (2006.01)

(52) U.S. Cl.
CPC .......... *G06F 30/20* (2020.01); *G01S 7/4052* (2013.01); *G02F 1/29* (2013.01); *G06G 7/78* (2013.01)

(58) Field of Classification Search
None
See application file for complete search history.

(56) References Cited

U.S. PATENT DOCUMENTS

| | | |
|---|---|---|
| 4,686,127 A | 8/1987 | Burns et al. |
| 5,789,830 A | 8/1998 | Portegies et al. |
| 2003/0102999 A1* | 6/2003 | Bergin .......... G01S 7/412 342/121 |
| 2007/0282560 A1 | 6/2007 | Anderson |
| 2009/0051681 A1* | 2/2009 | Sharp .......... A63F 13/10 345/419 |
| 2012/0259603 A1 | 10/2012 | Ong et al. |
| 2013/0271317 A1 | 10/2013 | Goel et al. |
| 2016/0074669 A1 | 3/2016 | Grant et al. |

(Continued)

OTHER PUBLICATIONS

Dictionary.com, Define Simulator, 2018, Dictionary.com, p. 1.*

(Continued)

*Primary Examiner* — Omar F Fernandez Rivas
*Assistant Examiner* — Bernard E Cothran
(74) *Attorney, Agent, or Firm* — Law Firm of Stuart S. Levy

(57) ABSTRACT

A simulator is provided for dynamically testing and evaluating an electromagnetic radiation in real-time. The performance of radiation from a system-under-test is evaluated as it interacts with a moving target in an ever-changing simulated environment. The simulator includes a computer for synchronized control of a PNT database and of an environmental database. In detail, the PNT database contains Position, Navigation and Timing (PNT) information of the target, and the environmental database contains information pertaining to meteorological conditions and topographical characteristics in the simulated environment. In combination, the computer evaluates a synchronized interaction of the electromagnetic radiation with the PNT information from the PNT database, under conditions set by the environmental database. A response record for evaluating a performance of the system-under-test is thereby created.

18 Claims, 1 Drawing Sheet

(56) References Cited

U.S. PATENT DOCUMENTS

2016/0076019 A1     3/2016   Grant et al.
2017/0206287 A1     7/2017   Bergin et al.

OTHER PUBLICATIONS

Pendleton, The Fundamentals of GPS, Jul. 17, 2002, Directions Magazine, pp. 1-11 (Year: 2002).*
Lucas, What Is Electromagnetic Radiation?, Mar. 12, 2015, Live Science, pp. 1-5 (Year: 2015).*
Lifewire, What Is a GPS Almanac?, 2020, Lifewire, pp. 1-3 (Year: 2020).*
Huxley College of the Environment, GPS Ephemeris Data, 2020, Huxley College of the Environment, pp. 1-3 (Year: 2020).*
PCT International Search Report, Application No. PCT/US2016/058830, dated Oct. 26, 2016.
Bergin et al., A New Approach for Testing Autonomous and Fully Adaptive Radars, 2017, IEEE Radar Conference Paper.

* cited by examiner

REAL-TIME ELECTROMAGNETIC ENVIRONMENTAL SIMULATOR

FIELD OF THE INVENTION

The present invention pertains to simulators. More particularly, the present invention pertains to computer-controlled simulators that are useful for the real-time testing and evaluation of electromagnetic radiations in a simulated environment. The present invention is particularly, but not exclusively, useful for testing and evaluating radio frequency (RF) and intermediate frequency (IF) systems under dynamic conditions wherein the system must interact with a moving target, clutter and RF interference in a continuously changing environment.

BACKGROUND OF THE INVENTION

It is well known that operational field testing of electronic equipment can be both time consuming and expensive. This is particularly the case when comprehensive testing requires a real-time evaluation of the equipment (i.e. a system-under-test) in a dynamic environment. More specifically, when dramatic changes between separate and different test environments (e.g. meteorological conditions) are involved, comprehensive field testing may become impractical or cost prohibitive.

Signal processing and computing techniques have now been refined to a point where high performance computing (HPC) is nearly commonplace for a plethora of different applications. Insofar as electromagnetic (EM) radiations are concerned, HPC applications deserve consideration. In particular, Radio Frequency (RF) and Intermediate Frequency (IF) radiations from radar systems are of interest for the present invention. With this in mind, the present invention recognizes that computer simulations can effectively be employed to test and evaluate the influence different simulated environments can have on EM radiations. Moreover, the present invention recognizes that such testing and evaluation can be conducted under simulated conditions for an actual system-under-test, in real-time.

With the above in mind, it is an object of the present invention to provide a system and method for testing and evaluating a high-fidelity emulation of a complex RF/IF channel model for radar, communications, and signals intelligence. Another object of the present invention is to provide a simulator that interfaces directly with an RF/IF system-under-test to give an "input-output" response from a simulated environment that exactly mimics what would be seen if the system-under-test were to radiate freely into an actual environment. Still another object of the present invention is to provide a system and method that is easy to manufacture, is simple to use, and is comparatively cost effective.

SUMMARY OF THE INVENTION

In accordance with the present invention, a simulator is provided for environmentally testing and evaluating an electromagnetic radiation from a system-under-test. More specifically, the electromagnetic radiation will be actually generated by the system-under-test; but it will thereafter be computer-controlled by the simulator. Structurally, in addition to a computer (computation machine), the simulator includes an environmental database for creating a simulated test environment, and a PNT database for moving the target through the simulated environment.

In detail, the database contains information pertaining to Position, Navigation and Timing (PNT) information of a target in a simulated environment. For purposes of the present invention, the target will typically be a simulated aircraft, and the PNT information will include flight routes and operating schedules for the aircraft. As envisioned for the present invention, however, in addition to being an aircraft, the target may be a spacecraft, a ground vehicle, humans or a maritime vessel.

The environmental database will typically contain information pertinent to meteorological conditions and topographical characteristics for the simulated environment. Further, the environmental database will also include electronic conditions in the simulated environment, as well as land use and land cover data, digital terrain/elevation maps, and locations for co-channel electromagnetic radiation emitters. Importantly, the environmental database will also include a predetermined location for a transceiver in the simulated environment. Operationally, the transceiver location is where a simulated electromagnetic radiation is to be transmitted into the simulated environment.

As implied above, the computer is connected with both the PNT database and with the environmental database. In this combination, the computer evaluates, in real-time, a synchronized interaction of the electromagnetic radiation with the PNT information of the target. For the present invention this evaluation is accomplished under conditions that are set by pertinent data from the environmental database. The result is the creation of a response record for evaluating the performance of the system-under-test.

In essence, the response record is based on a computer evaluation of return signals that are received by the transceiver in the simulated environment. In particular, these return signals evidence the influence that a synchronized interaction between PNT information and data from the environmental database has had on the electromagnetic radiation. The evaluation of this interaction is accomplished in real-time.

Some additional considerations for the present invention are based on the requirement that PNT information established for the target is done so relative to the predetermined location of the transceiver in the simulated environment. As a consequence of this relationship, the PNT information is synchronized with directional information from the transceiver for a transmission of the electromagnetic radiation into the simulated environment. Similarly, the reception of a return signal at the transceiver is also synchronized. For these purposes, the simulated environment is considered to be three-dimensional, and the directional information for transmitting the electromagnetic radiation from the transceiver includes variables corresponding to spherical co-ordinates $\theta$, $\phi$ and r.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
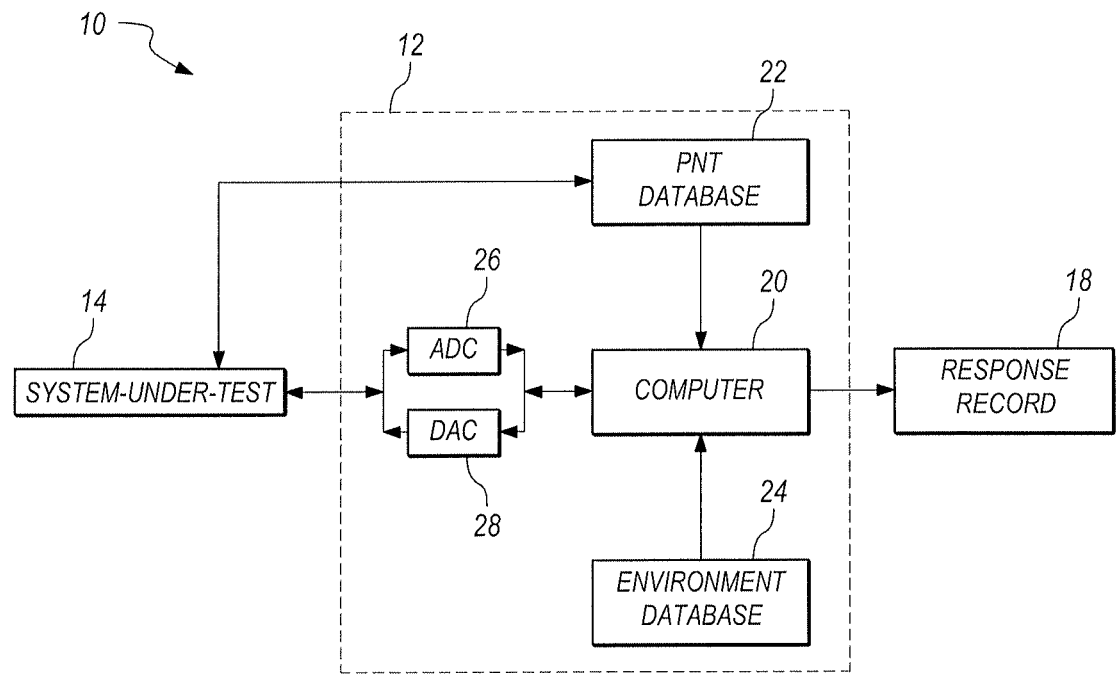
FIG. 1 is a schematic presentation of components used in a simulator of the present invention for evaluating an electromagnetic radiation from a system-under-test in a simulated environment.

Referring initially to FIG. 1, a schematic layout of the various interconnections between essential components of the present invention is shown and is generally designated 10. As shown, a simulator 12 is connected directly with a system-under-test (SUT) 14. For purposes of the present invention, the SUT 14 may be any system, apparatus or device that is capable of generating a beam of electromagnetic radiation. Further, the SUT 14 may be a prototype, an R & D test device, or an actual operational system that has been, or is intended to be, commercially available. In accordance with the present invention, the electromagnetic radiation that is generated by the SUT 14 is preferably a waveform with a Radio Frequency (RF), or an Intermediate Frequency (IF).

In operational overview, during an operation of the present invention the electromagnetic radiation is actually generated by the SUT 14. Measured operational parameters of the electromagnetic radiation (e.g. intensity, wavelength and phase) are then converted from analog to digital signals and are collectively transmitted into a simulated environment 16 (see FIG. 2), as the electromagnetic radiation that is established by the simulator 12. A return signal of the electromagnetic radiation is also received from within the simulated environment 16. The result is a response record 18 which is used to evaluate the performance of the SUT 14.

Still referring to FIG. 1, it is seen that the simulator 12 includes a computer (i.e. a computation engine) 20 which is connected directly to a Position, Navigation and Timing (PNT) database 22 and to an environmental database 24. Additionally, FIG. 1 shows that the computer 20 is connected with the SUT 14 via a high-speed, analog-to-digital converter (ADC) 26, and a high-speed, digital-to-analog (DAC) converter 28. In this combination, ADC 26 is capable of operating at the RF/IF frequencies for an electromagnetic radiation generated by the SUT 14 to thereby create a digital waveform for "input" to the computer 20. On the other hand, DAC 28 is capable of transforming a real-time, in-phase digital "output" from the computer 20 into an analog RF/IF signal for evaluation. As intended for the present invention, the "input-output" for SUT 14 from the simulator 12 perfectly emulates the performance of the SUT 14 as if it was radiating freely into an actual environment.

Figure 2:
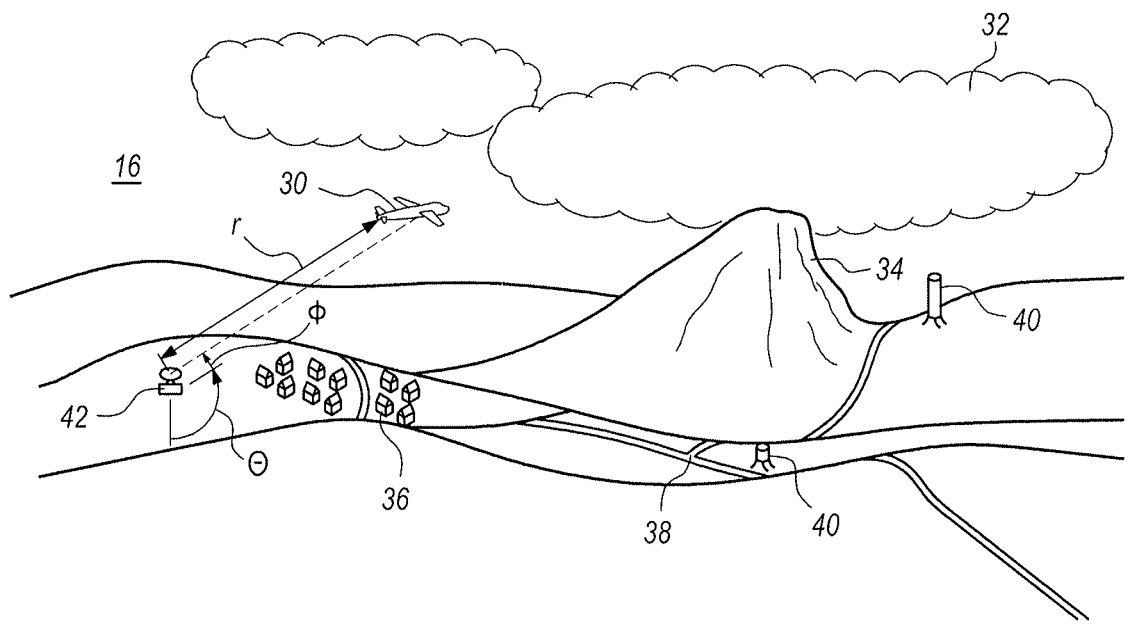
FIG. 2 is an exemplary electromagnetic environment which is simulated for use in an operation of the present invention.

With reference to FIG. 2 it is to be appreciated that the PNT database 22 will contain data that is pertinent to Position, Navigation and Timing (PNT) information for a target 30 in the simulated environment 16. For purposes of the present invention, the target 30 will typically be a simulated aircraft, and the PNT information will include flight routes, inflight maneuvers, and operating schedules for the aircraft.

Still referring to FIG. 2 it will be appreciated that the environmental database 24 will typically contain information pertinent to meteorological conditions (e.g. clouds 32) and topographical characteristics (e.g. mountain 34) for the simulated environment 16. Further, the environmental database 24 will include electronic conditions in the simulated environment, as well as land use and land cover data (e.g. village 36 and roads 38). Also, digital terrain/elevation maps, and locations for co-channel electromagnetic radiation emitters 40 may be included in the environmental database 24.

Importantly, the environmental database 24 will also include a predetermined location for a transceiver 42 in the simulated environment 16. Operationally, the location of transceiver 42 may be anywhere in the simulated environment 16 that is selected for testing the transmission of a simulated electromagnetic radiation from the transceiver 42 into the simulated environment 16.

As envisioned for the present invention, it is to be appreciated that the PNT information established for the target 30 is done so relative to the predetermined location of the transceiver 42 in the simulated environment 16. As a consequence of this relationship, the PNT information is synchronized with directional information from the transceiver 42 for a transmission and reception of the electromagnetic radiation in the simulated environment 16. For these purposes, the simulated environment 16 is considered to be three-dimensional, and the directional information for transmitting the electromagnetic radiation from the transceiver 42 includes variables corresponding to spherical co-ordinates $\theta$, $\phi$ and r.

The result from an operation of the simulator 12 is the response record 18. In detail, the response record 18 is based on a computer evaluation of the return signals that are received by the transceiver 42 in the simulated environment 16. With this in mind, the response record 18 is essentially derived from the transformed "output" that is provided by DAC 28 to the SUT 14. Thus, from a signal processing perspective, these return signals (i.e. "output") evidence the influence that a synchronized interaction between PNT information from the PNT database 22 and data from the environmental database 24 has had on the electromagnetic radiation. The evaluation of this interaction, and the preparation of the response record 18, are accomplished in real-time.

While the particular Real-Time Electromagnetic Environmental Simulator as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A simulator for environmentally testing and evaluating an electromagnetic radiation generated by a system-under-test, from a test platform located in a simulated environment, wherein the simulator comprises:

a PNT database containing data pertaining to Position, Navigation and Timing (PNT) information of a target located in the simulated environment and the test platform located in the simulated environment;

an environmental database containing meteorological conditions and topographical characteristics for the simulated environment; wherein the environment database is used to create the simulated environment;

a computer connected with the PNT database and with the environmental database for processing return signals from the system-under-test, in the simulated environment, in real-time, wherein the return signals are indicative of a synchronized interaction of the electromagnetic radiation from the system-under-test, under predetermined conditions set by pertinent data from the environmental database, to create a response record for evaluating a performance of electromagnetic radiation generated by the system-under-test in the simulated environment; and wherein the response record is based on a return signal received by a transceiver in the simulated environment in response to a simulated transmission of the electromagnetic radiation from the transceiver, and wherein the return signal is determined by a real-time interaction of the electromagnetic radiation with PNT information and data from the environmental database.

2. The simulator of claim 1 wherein the environmental data further includes a predetermined location for a transceiver of the electromagnetic radiation in the simulated environment.

3. The simulator of claim 2 wherein the PNT information is established relative to the predetermined location for the transceiver in the simulated environment.

4. The simulator of claim 3 wherein the PNT information is synchronized with directional information for a transmission of the electromagnetic radiation from the transceiver into the simulated environment and for a reception of a return signal at the transceiver, and wherein the return signal is a response to the transmitted electromagnetic radiation.

5. The simulator of claim 4 wherein the simulated environment is three-dimensional, and the directional information for transmitting the electromagnetic radiation from the transceiver includes variables corresponding to spherical co-ordinates θ Φ and r.

6. The simulator of claim 1 wherein the environmental data includes, electronic conditions in the simulated environment, land use and land cover data, digital terrain/elevation maps, and locations of co-channel electromagnetic radiation emitters.

7. The simulator of claim 1 wherein the test platform is selected from the group consisting of a simulated aircraft, spacecraft, ground vehicle and maritime vessel, and the PNT information includes flight routes and operating schedules for the test platform.

8. A computer for use in a simulator to environmentally test and evaluate an electromagnetic radiation from a system-under-test located on a test platform in a simulated environment, the computer comprising:

a PNT database connected into the computer, wherein the PNT database includes data pertaining to Position, Navigation and Timing (PNT) information of a target located in the simulated environment and the test platform located in the simulated environment, and wherein the PNT information is established relative to a predetermined location for a transceiver in the simulated environment;

an environmental database connected into the computer, wherein the environmental database includes information pertaining to meteorological conditions and topographical characteristics in the simulated environment; wherein the environment database is used to create the simulated environment;

a computation engine in the computer connected with the PNT database and with the environmental database for processing, in real-time, a synchronized interaction of the electromagnetic radiation from the system-under-test with predetermined PNT information from the PNT database, under predetermined conditions set by pertinent environmental data from the environmental database, to create a response record for evaluating, in the simulated environment, a performance of electromagnetic radiation generated by the system-under-test; and wherein the response record is based on a return signal received by a transceiver in the simulated environment in response to a simulated transmission of the electromagnetic radiation from the transceiver, and wherein the return signal is determined by a real-time interaction of the electromagnetic radiation with PNT information and data from the environmental database.

9. The computer of claim 8 wherein the PNT information is established relative to the predetermined location for the transceiver in the simulated environment, and wherein the PNT information is synchronized with directional information for a transmission of the electromagnetic radiation from the transceiver into the simulated environment, and for a reception of a return signal at the transceiver, wherein the return signal is a response to the transmitted electromagnetic radiation.

10. The computer of claim 9 wherein the simulated environment is three-dimensional, and the directional information for transmitting the electromagnetic radiation from the transceiver includes variables corresponding to spherical co-ordinates θ, Φ and r.

11. The computer of claim 8 wherein the environmental data includes, electronic conditions in the simulated environment, land use and land cover data, digital terrain/elevation maps, and locations of co-channel electromagnetic radiation emitters.

12. The computer of claim 8 wherein the test platform is selected from the group consisting of a simulated aircraft, spacecraft, ground vehicle and maritime vessel, and the PNT information includes flight routes and operating schedules for the test platform.

13. A non-transitory, computer-readable medium having executable instructions stored thereon to direct a computer system in performing a process for evaluating an electromagnetic radiation from a system-under-test located on a test platform within a simulated environment, the executable instructions comprising:

retrieving environmental data from a first database in a simulator, wherein the environmental data pertains to meteorological conditions and topographical characteristics in the simulated environment, and includes a location for a transceiver of the electromagnetic radiation in the simulated environment, and wherein the transceiver originates the electromagnetic radiation from the system-under-test at the location; wherein the first database with the environmental data is used to create the simulated environment;

retrieving data from a second database to Position, Navigation, and Timing (PNT) information of a target located in the simulated environment for the test platform located in the simulated environment;

a test platform processing, in real-time, in the simulated environment return signals from the system-under-test, wherein the return signals are indicative of a synchronized interaction of the electromagnetic radiation from the system-under-test with predetermined PNT information from the second database, under predetermined conditions set by pertinent environmental data from the first database, to create a response record for evaluating a performance of electromagnetic radiation generated by the system-under-test; and wherein the response record is based on a return signal received by a transceiver in the simulated environment in response to a simulated transmission of the electromagnetic radiation from the transceiver, and wherein the return signal is determined by a real-time interaction of the electromagnetic radiation with PNT information and data from the environmental database.

14. The medium of claim 13 wherein the environmental data includes, electronic conditions in the simulated environment, land use and land cover data, digital terrain/elevation maps, and locations of co-channel electromagnetic radiation emitters.

15. The medium of claim 13 wherein the test platform is selected from the group consisting of a simulated aircraft, spacecraft, ground vehicle and maritime vessel, and the PNT information includes flight routes and operating schedules for the test platform.

16. The medium of claim 15 further comprising an executable instruction for synchronizing target data in the PNT information with directional information for a transmission of the electromagnetic radiation from the transceiver into the simulated environment, and for a reception of a return signal at the transceiver, wherein the return signal is a response to the transmitted electromagnetic radiation.

17. The medium of claim 16 wherein the simulated environment is three-dimensional, and the directional information for the electromagnetic radiation includes variables corresponding to spherical co-ordinates $\theta$, $\Phi$ and r.

18. The medium of claim 13 further comprising an executable instruction for preparing the response record, wherein the response record is based on a return signal received by the transceiver, and wherein the return signal is determined by a real-time interaction of the electromagnetic radiation with PNT information and data from the environmental database.

* * * * *